United States Patent [19]

Rapp et al.

[11] Patent Number: 5,583,425
[45] Date of Patent: Dec. 10, 1996

[54] VOLTAGE COMPARATOR WITH CONTROLLED OUTPUT CURRENT PROPORTIONAL TO DIFFERENCE VOLTAGE

[75] Inventors: A. Karl Rapp, Los Gatos; Lee L. Stoian, Saratoga, both of Calif.

[73] Assignee: National Semiconductor Corporation, Santa Clara, Calif.

[21] Appl. No.: 94,648

[22] Filed: Jul. 21, 1993

[51] Int. Cl.$^6$ ..................................................... G05F 3/16
[52] U.S. Cl. ............................ 323/316; 327/73; 327/109; 327/563
[58] Field of Search .................................. 307/270, 296.4, 307/296.6, 296.7, 296.8, 354, 356, 359, 363, 496, 497, 574, 315; 323/316; 327/109

[56] References Cited

U.S. PATENT DOCUMENTS

| | | | |
|---|---|---|---|
| 4,151,482 | 4/1979 | Robe | 330/308 |
| 4,251,743 | 2/1981 | Hareyama | 307/496 |
| 4,656,374 | 4/1987 | Rapp | 307/475 |
| 4,977,336 | 12/1990 | Martiny | 323/316 |
| 5,038,055 | 8/1991 | Kinoshita | 307/494 |
| 5,089,769 | 2/1992 | Petty et al. | 323/316 |

FOREIGN PATENT DOCUMENTS 0415620  3/1991  European Pat. Off. .

OTHER PUBLICATIONS

M. Rybicki, "A Push Pull Transconductance Amplifier with Extended Power Supply and Common Mode Range", Motorola Technical Developments, vol. 9, (Aug. 1989) pp. 58–59.

Chung–Yu Wu et al. "New Fully Differential HF CMOS OP AMP's with Efficient Common Mode Feedback", 1989 IEEE International Symposium on Circuits and Systems, vol. 3, (May 1989) pp. 2076–2079.

J. Fisher "A Highly Linear CMOS Buffer Amplifier", *IEEE Journal of Solid–State Circuits*, vol. SC–22, No. 3 1987 pp. 330–332 (pp. 333–334 still not found).

D. Senderowicz et al. "PCM Telephony: Reduces Architecture for D/A Converter and Filter Combination" *IEEE Journal of Solid–State Circuits*, vol. 25, No. 4 (Aug. 1990) pp. 987–995.

Primary Examiner—Peter S. Wong
Assistant Examiner—Shawn Riley
Attorney, Agent, or Firm—Limbach & Limbach L.L.P.

[57] ABSTRACT

A voltage comparator produces a current output as a function of the differential input voltage. Three transfer functions are detailed. In the linear transfer mode the output varies linearly in the transition region and swings between zero and a well-defined current value. In a truncated response mode, the output is zero for zero differential input voltage, remains at zero for one input voltage polarity, and rises for the other polarity input linearly to a well-defined current value. In the folded response mode the output current is zero for zero differential input and rises linearly in the transition region to a well-defined current value for either polarity of differential input. While a CMOS form of construction is preferred, bipolar construction is also shown.

34 Claims, 4 Drawing Sheets

FIG. 7

VOLTAGE COMPARATOR WITH CONTROLLED OUTPUT CURRENT PROPORTIONAL TO DIFFERENCE VOLTAGE

BACKGROUND OF THE INVENTION

A voltage comparator is useful as a sense amplifier which produces an output current that is related to the differential voltage input. U.S. Pat. No. 4,656,374, which issued on Apr. 7, 1987, and is assigned to the assignee of the present invention, discloses such a circuit which was useful in static memory devices. The teaching in this patent is incorporated herein by reference. Basically, such a circuit produces an output current which flows when the noninverting input voltage rises above the voltage on the inverting input. Thus, it is essentially digital in operation. By employing a relatively high gain comparator the region of linear response is made small in relation to the d-c potentials normally applied to the input terminals. Generally speaking, the shape of the voltage to current transfer function is not controlled and the output current is made large with respect to a subsequent digital input threshold.

SUMMARY OF THE INVENTION

It is an object of the invention to provide a voltage comparator circuit which provides a controlled current output and has a predetermined voltage to current transfer function.

It is a further object of the invention to provide a voltage comparator circuit which can be configured to produce an output current that has a linear, truncated or folded voltage-to-current transfer function and produces a well defined current output.

These and other objects are achieved in a circuit configured as follows. While CMOS construction is preferred, the well known bipolar equivalent can be employed. A small, but well defined current is employed to create both N and P channel transistor bias lines. The P channel bias is slightly over a threshold below the $+V_{DD}$ supply and the N channel bias is slightly over a threshold above ground (or the negative $V_{DD}$ rail). A differential input stage is operated at a suitable tail current and its output applied to a coupling transistor which is biased to pass a current that is related to the circuit differential input. The coupling transistor drives a current mirror output stage which therefore produces a current output proportional to the differential input. Since the input stage is operated at a well defined tail current the maximum output current is well defined at a level that is determined by the current mirror gain. Thus, the output current is well defined for input extremes and is linear in the transition region.

A truncated transfer characteristic is achieved by employing symmetrical input stage loads and includes a second coupling transistor. The coupling transistor outputs are subtractively combined and applied to the current mirror output stage. Thus, at zero differential input, the output is zero (truncated). For one input polarity the output remains at zero and for the other input polarity the output rises linearly to the well defined maximum current value.

A folded response is achieved by subtracting the coupling transistor currents and mirroring the results individually to a pair of output transistors. Thus, at zero differential input, where the coupling transistor currents are equal, the output will be zero. For either polarity of differential input the output current will rise linearly to the well defined maximum current value.

DESCRIPTION OF THE INVENTION

Figure 1:
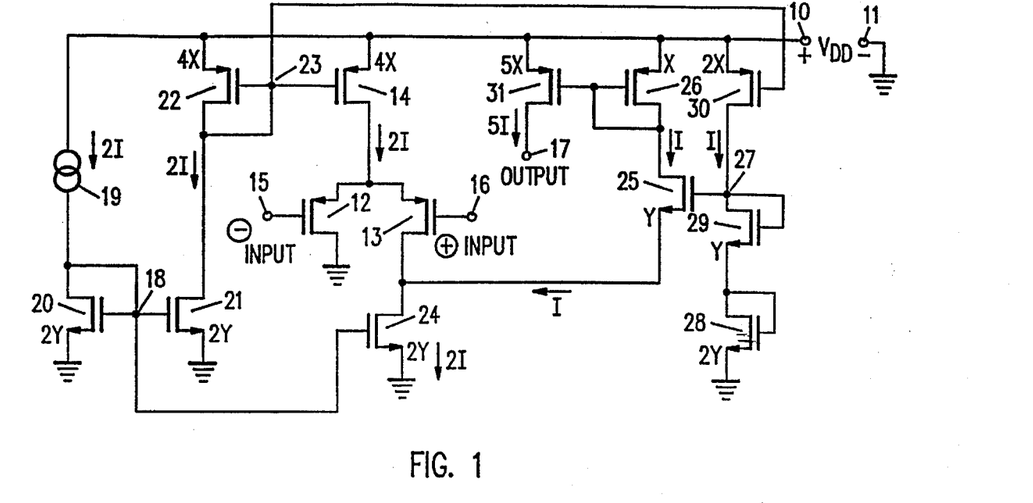
FIG. 1 is a schematic diagram of a comparator circuit which has a linear response.
Figure 7:
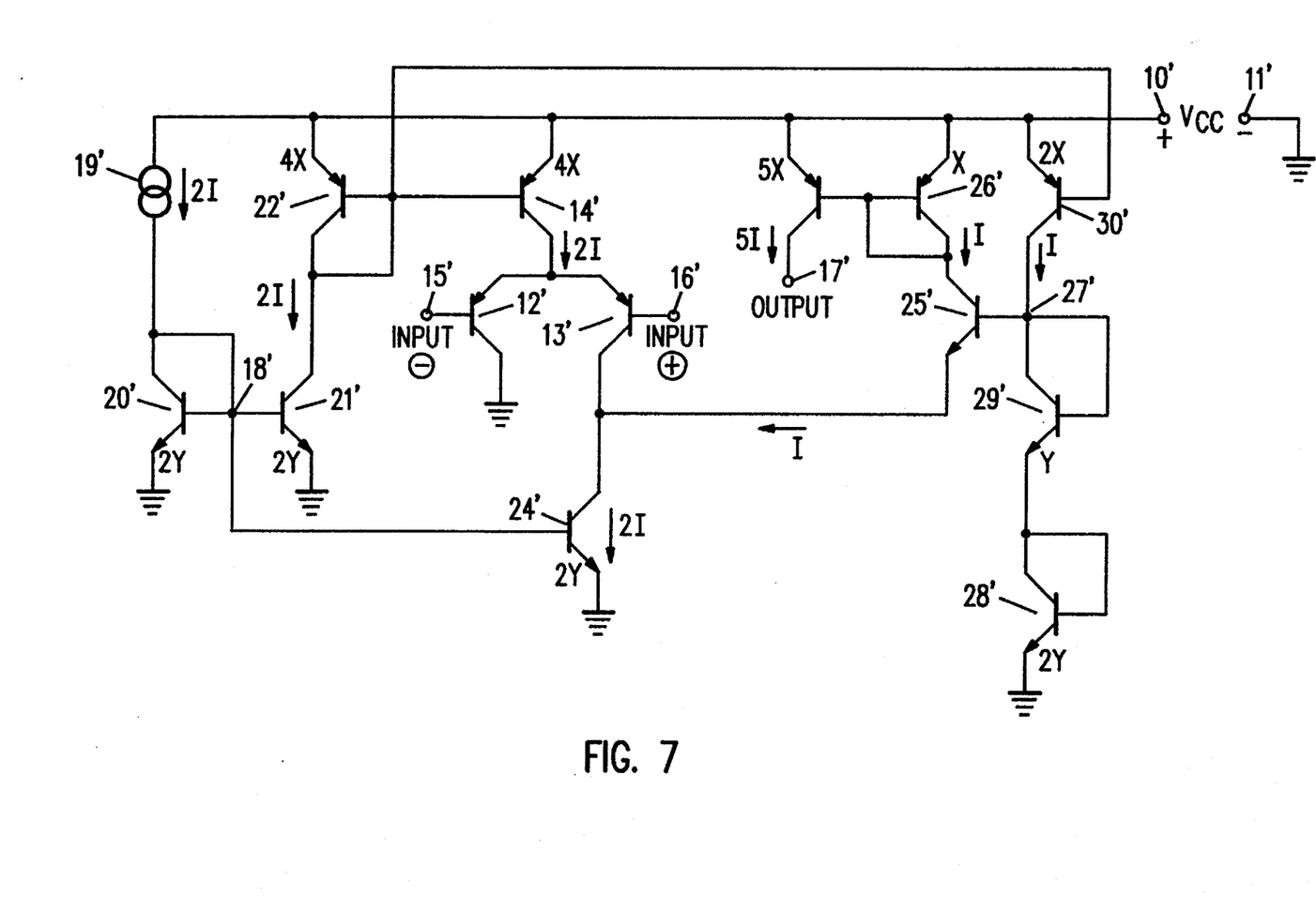
FIG. 7 is a schematic diagram of a bipolar transistor version of the FIG. 1 circuit.

With reference to FIG. 1, a CMOS comparator circuit is operated from a $V_{DD}$ power supply connected + to terminal 10 and − to ground terminal 11. It is to be understood that while FIG. 1 is a CMOS implementation, bipolar transistors could be employed as shown in FIG. 7. This capability will be explained in greater detail subsequently. The small numbers adjacent to the transistor sources denote the relative size of the transistors. The heart of the circuit is the input stage composed of P channel transistors 12 and 13 which are operated differentially by means of a tail current source P channel transistor 14 which applies a constant current to the commonly connected sources. Transistors 12 and 13 are matched and have a relatively short and wide channel. This results in a substantial transconductance. Terminal 17 constitutes the circuit output terminal. Inverting input terminal 15 is connected to the gate of transistor 12 and noninverting input, terminal 16 is connected to the gate of transistor 13.

An N channel transistor bias source is created at node 18 by passing a controlled current 2I from constant current source 19 through N channel transistor 20 which has its gate connected to its drain. If N channel transistor 21 matches transistor 20, 2I will also flow in it and consequently 2I will flow in P channel transistor 22, which has its gate connected to its drain. Accordingly, a P channel bias source is developed at node 23, which is operated at slightly over a $V_\tau$ below $+V_{DD}$. This bias source causes 2I tail current to flow in transistor 14.

Node 23 is connected to the gate of P channel transistor 30, which thereby acts as a current source to mirror a current I into node 27. This current value is present because transistor 30 is one-half of the size of transistor 22. N channel transistors 28 and 29, each of which have their gates connected to their drains, will conduct I and thereby bias node 27 at slightly over two thresholds above ground. The gate of N channel coupling transistor 25 is connected to node 27.

When input terminal 15 is pulled negative, with respect to terminal 16, the tail current of the input stage will be shifted into transistor 12. In other words, the tail current will flow to ground. As this bias is increased, at some point, conduction in transistor 13 will cease. Here N channel load transistor 24 will pull the source of transistor 25 down, thereby increasing its conduction to where 2I will flow in both transistors 25 and 26. Thus, transistor 31, being 5 times the size of transistor 26 and connected thereto as a current mirror, will source 10I to output terminal 17. This constitutes the upper current limit in the FIG. 2 graph.

Conversely, when input terminal 15 rises above terminal 16, the tail current will predominate in transistor 13. At some point, such a shift in input will result in 2I flowing in transistor 13. This will pull the source of transistor 25 up so as to turn it off. In other words, transistor 13 satisfies the conduction in transistor 24 and no current is sunk out of transistor 25. Accordingly, the current sourced by transistor 31 goes to zero. This constitutes the zero current limiting shown in the FIG. 2 graph.

Figure 2:
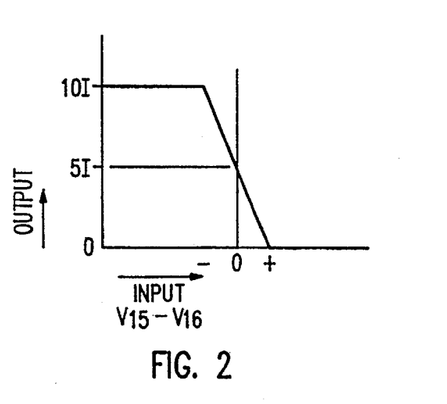
FIG. 2 is a graph showing the response of the circuit of FIG. 1.

In between the upper and lower current limits of the circuit, the change in output current, as a function of differential input bias, is linear. As can be seen, the zero bias condition is precisely one-half of the maximum current.

Figure 3:
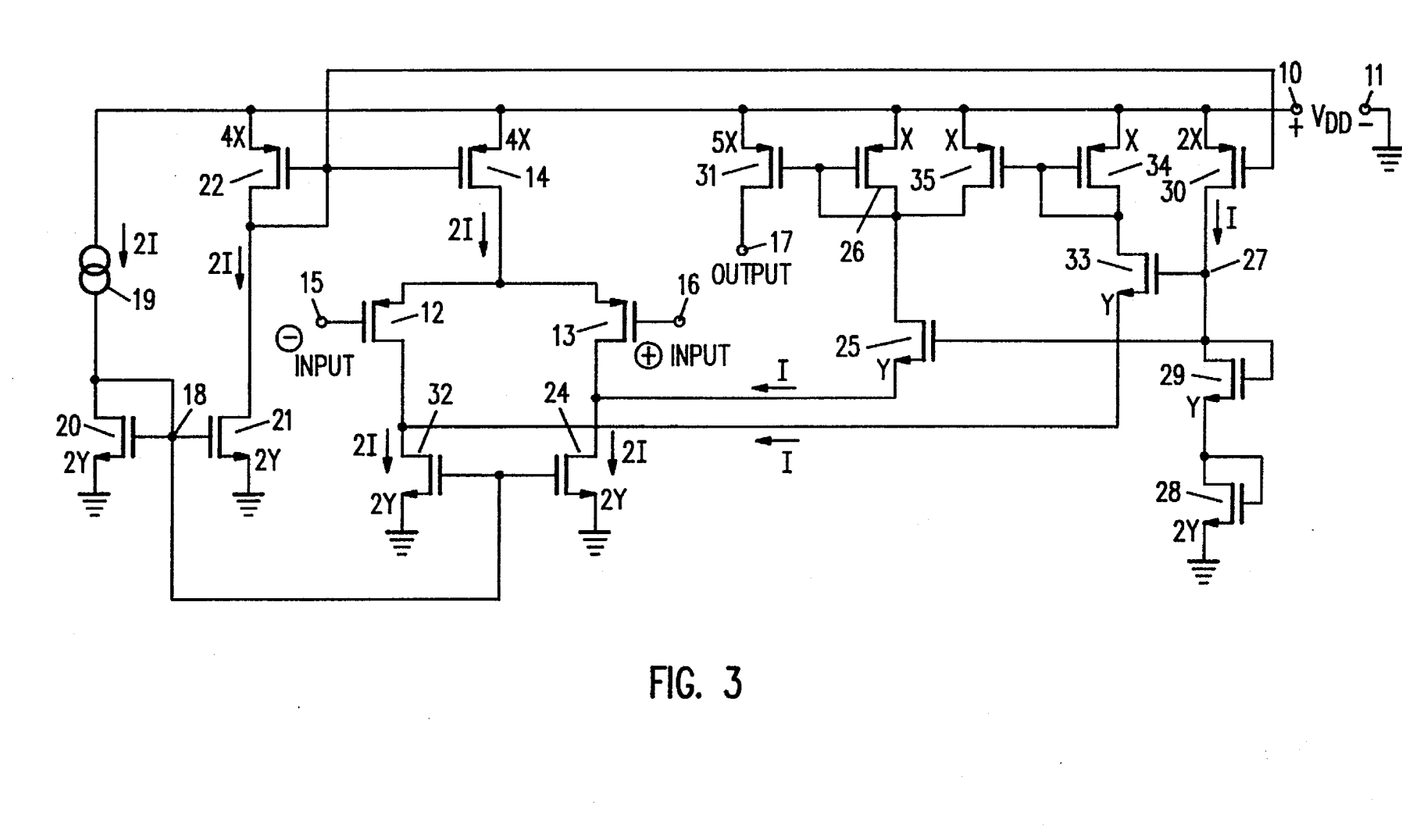
FIG. 3 is a schematic diagram of a comparator circuit which has a truncated response.
Figure 4:
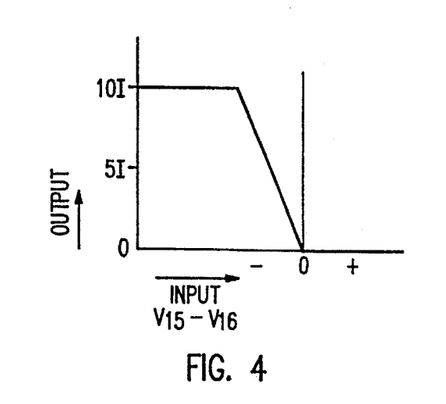
FIG. 4 is a graph showing the response of the circuit of FIG. 3.

FIG. 3 is a comparator circuit configuration that has a truncated transfer response shown in FIG. 4. Where the components function the same as those of FIG. 1, the same numerals are employed. Elements 10 through 31 are connected in manner of FIG. 1. However, N channel load transistor 32 has been added as a load element for input transistor 12. The drain of transistor 32 is connected to the source of N-channel coupling transistor 33. The gate of transistor 33 is connected to node 27 which is maintained at two N channel thresholds above ground, as described above. The drain of transistor 33 is connected to the drain of P channel transistor 34, which has its gate returned to its drain and its source connected to $+V_{DD}$. Transistor 34 forms a unity gain current mirror with P-channel transistor 35, which has its source and drain connected in parallel with transistor 26.

When input terminals 15 and 16 are at the same potential (zero differential input), a current, I, will flow in each of input transistors 12 and 13. Since each of transistors 24 and 32 are biased to conduct 2I, a current I must flow in each of transistors 25 and 33. This current flowing in transistor 34 will be reflected by the transistor 35 current mirror action so that I will flow into transistor 25 thereby supplying a balanced current. This means that zero current will flow in transistor 26 and hence zero current will flow in transistor 31. This set of conditions establishes the zero intercept of the graph of FIG. 4.

As the differential bias between terminals 15 and 16 is made more positive, the circuit output will remain at zero. For example, if 2I were to flow in transistor 13 the source of transistor 25 will be pulled up so as to turn it off and no current will flow into transistor 26. In the other side of the circuit, transistor 32 will pull 2I through transistors 33 and 34 and this, in turn, will turn transistor 35 on so as to pull the gate and drain of transistor 26 up so as to insure zero conduction in transistors 26 and 31.

On the other hand, as the differential input acts to increase conduction in transistor 12, another action takes place. For the condition where the 2I tail current flows entirely in transistor 12, the source of transistor 33 will be pulled up so as to turn it off and no current will flow in transistors 34 and 35. Conduction in transistor 24 will pull the source of transistor 25 down so as to turn it on thereby producing a 2I conduction in transistors 25 and 26. This current is reflected in the transistors 26 and 31 as 10I at output terminal 17. This defines the upper or maximum current in the graph of FIG. 4.

The two intercepts, shown in FIG. 4, represent the extreme states of the output current and the transition region is linear. That is, the 5I portion of the curve is half-way between the two intercepts.

Figure 5:
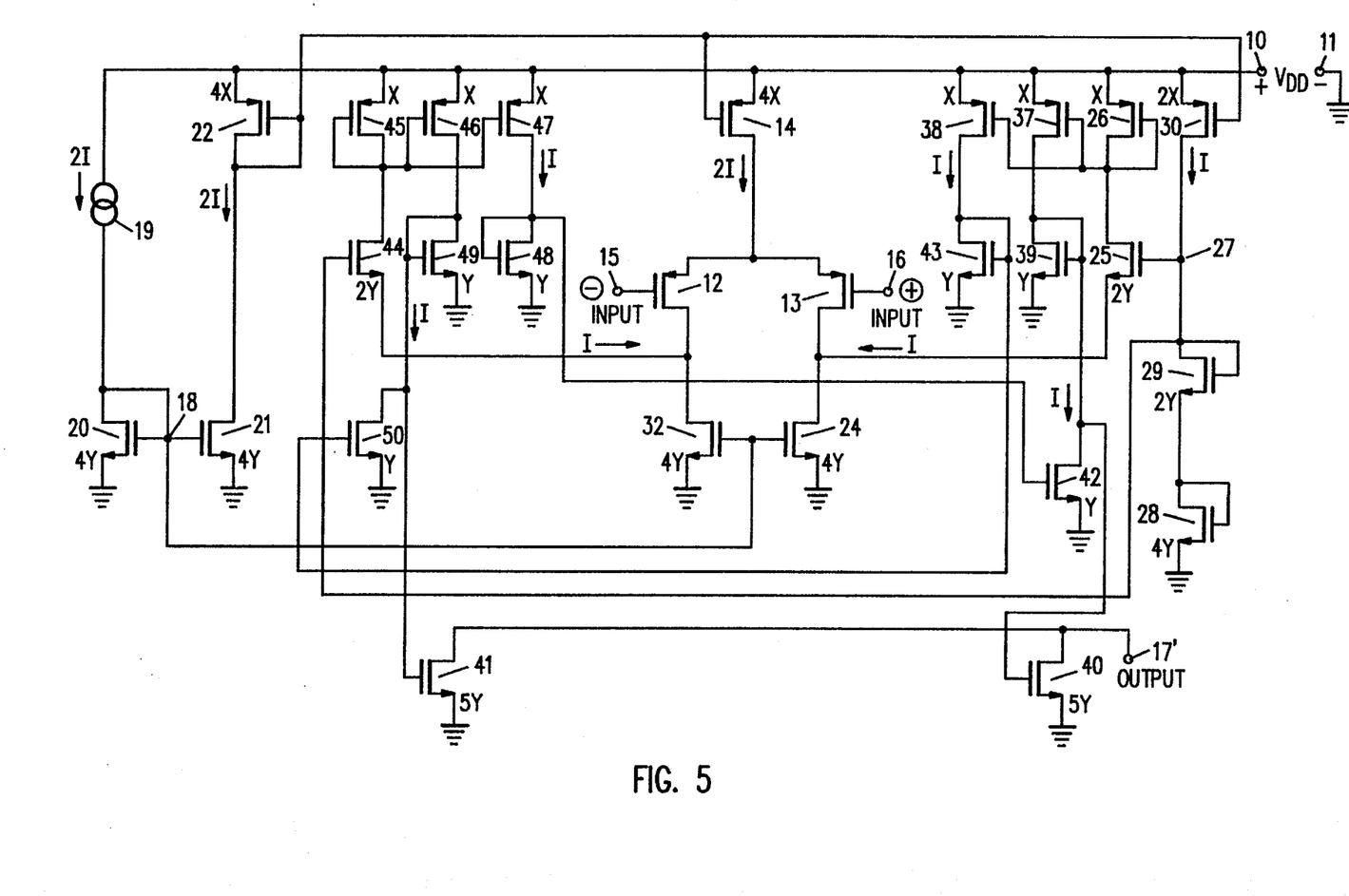
FIG. 5 is a schematic diagram of a comparator circuit having a folded response.
Figure 6:
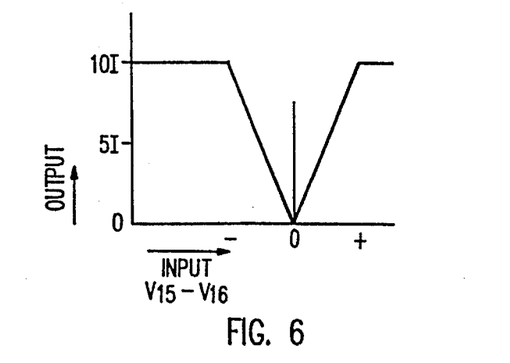
FIG. 6 is a graph showing the response of the circuit of FIG. 5.

FIG. 5 shows a schematic diagram of a CMOS comparator circuit having the folded response of FIG. 6. Again, where the components are the same as those of FIGS. 1 and 3, the same numerals are employed. One additional difference is that the circuit of FIG. 5 sinks the current shown in FIG. 6 rather than sourcing it. If a current source is required, an additional current mirror stage will be included.

Components 10 through 16, 18 through 30 and 32, function as discussed above for FIGS. 1 and 3. The main difference lies in a series of current mirrors that act to drive the pair of output transistors. N channel transistor 40 has its output coupled in parallel with N channel transistor 41 so that their combined conduction comprises the circuit output at terminal 17'.

At the zero differential input condition, where the input transistor 12 and 13 conduction is equalized, a current I will flow in each. Since transistors 24 and 32 are each biased to sink 2I, N channel transistors 25 and 44 will each pass a current I. Note that both transistors 25 and 44 have their gates connected to bias node 27 (two thresholds above ground).

Transistor 26 is connected as a current mirror with P channel transistors 37 and 38 while transistor 45 is connected as a current mirror with P channel transistors 46 and 47. Thus, each of transistors 37, 38, 46 and 47 will conduct a current I. The current in transistor 38 flows in N channel transistor 43, which is coupled as a current mirror to N channel transistor 50. Thus, transistor 50 will conduct the current passed by transistor 46 and in doing so will pull the gate of transistor 41 low and thus turn it off.

Similarly, transistor 42, which is connected as a current mirror to transistor to transistor 48, will conduct the current flowing out of transistor 37 and in so doing will pull the gate of transistor 40 low thereby turning it off. Thus, for the zero differential input bias, both output transistors 40 and 41 are off.

For the input condition shown in the left hand portion of the graph of FIG. 6, the conduction in transistor 12 will dominate so that transistor 13 is off. Conduction in transistor 12 will pull the source of transistor 44 up so as to turn it off. Since transistor 24 is biased to conduct 2I, it will pull the source of transistor 25 down so that the 2I will flow therein. Since transistor 44 is off, transistors 45 through 49 will also be off. Conversely, since transistor 25 is conducting 2I, transistors 26, 37–39 and 43 will each conduct 2I. Since transistor 40 is coupled as a current mirror to transistor 39 and is five times larger, 10I will flow in transistor 40. In the transition region to the left of zero bias, in the curve of FIG. 6, the shift between zero and 10I is linear.

When the input bias changes in the other direction and the terminal 15 potential exceeds that of terminal 16, the conduction of transistor 12 fails as the conduction in transistor 13 rises. In the extreme state, transistor 12 is off and the action of transistor 32 forces 2I to flow in transistor 44. Thus, 2I will flow in transistors 45 through 49. Transistor 42, which tries to mirror the current flowing in transistor 47, will pull the gate of transistor 40 low so as to turn it off. However, transistor 49, which is coupled to transistor 41 as a current miorror, will reflect the 2I flowing in transistor 46 into transistor 41 at a current gain of 5. Thus, 10I will flow in transistor 41. In the transition region to the right of zero bias, in the curve of FIG. 6, the shift between zero and 10I is linear.

While the above circuits are of CMOS construction, and this form is preferred for practicing the invention, bipolar transistors can be employed. FIG. 7 shows a bipolar transistor form of the FIG. 1 circuit configuration. The P channel transistors have been replaced with PNP transistors and the N channel transistors have been replaced with NPN transistors. The letters adjacent to the emitters denote relative emitter areas where such considerations are critical. In operation, the circuit of FIG. 7 performs substantially the same as the circuit of FIG. 1. Functionally, the bipolar transistors operate the same as the MOS transistors. The collectors are equivalent to drains, the emitters are equivalent to sources and the bases equivalent to gates. Where a current is passed through a MOS transistor having its gate connected to its drain, a $V_\tau$ (or threshold voltage) is developed. Where a current is passed through a bipolar transistor having its base connected to its collector, a $V_{BE}$ voltage (or one diode drop) is developed. Clearly, FIGS. 3 and 5 could also be equivalently constructed from bipolar elements.

The invention has been described and preferred embodiments detailed. When a person skilled in the art reads the foregoing description, alternatives and equivalents, within the spirit and intent of the invention, will be apparent. Accordingly, it is intended that the scope of the invention be limited only by the claims that follow.

We claim:

1. A differential comparator circuit for responding to a differential voltage input to produce an output current that is well defined and is a function of said differential input voltage, said circuit comprising:

means for developing a controlled current;

a pair of input stage transistors connected to operate differentially by means of a tail current based upon said controlled current;

a first load transistor coupled into said input stage and biased to pass a current based upon said controlled current;

a first coupling transistor connected to said first load transistor and biased to pass a first fraction of said load transistor current wherein said first fraction is a function of said differential input voltage and limited to the range of zero to one, wherein said first coupling transistor has a source/emitter connected to said first load transistor and a gate/base connected to a bias source level whereby the output of said coupling transistor is a linear function of said differential input voltage and has a zero differential input response equal to one-half of said controlled current; and a current mirror having an input coupled to receive the current passed by said first coupling transistor to provide a circuit output in the form of a current based upon said controlled current.

2. The differential comparator circuit of claim 1 wherein said bias source for said first coupling transistor is operated at about two times a transistor threshold/$V_{BE}$ above a reference level.

3. A differential comparator circuit for responding to a differential voltage input to produce an output current that is well defined and is a function of said differential input voltage, said circuit comprising:

means for developing a controlled current;

a pair of input stage transistors connected to operate differentially by means of a tail current based upon said controlled current;

a first load transistor coupled into said input stage and biased to pass a current based upon said controlled current;

a first coupling transistor connected to said first load transistor and biased to pass a first fraction of said load transistor current wherein said first fraction is a function of said differential input voltage and limited to the range of zero to one;

a current mirror having an input coupled to receive the current passed by said first coupling transistor to provide a circuit output in the form of a current based upon said controlled current;

a second load transistor coupled to said input stage thereby providing a balanced load configuration for said input stage;

a second coupling transistor connected to said second load transistor and biased to pass a second fraction of said controlled current; and means for subtractively combining the currents flowing in said first and second coupling transistors whereby, at zero differential input, the circuit output current is zero and the circuit transfer response is truncated by falling to zero at a balanced input and rising only for one polarity of input differential.

4. A differential comparator circuit for responding to a differential voltage input to produce an output current that is well defined and is a function of said differential input voltage, said circuit comprising:

means for developing a controlled current;

a pair of input stage transistors connected to operate differentially by means of a tail current based upon said controlled current;

a first load transistor coupled into said input stage and biased to pass a current based upon said controlled current;

a first coupling transistor connected to said first load transistor and biased to pass a first fraction of said load transistor current wherein said first fraction is a function of said differential input voltage and limited to the range of zero to one;

a current mirror having an input coupled to receive the current passed by said first coupling transistor to provide a circuit output in the form of a current based upon said controlled current;

a second load transistor coupled to said input stage thereby providing a balanced load configuration for said input stage;

a second coupling transistor connected to said second load transistor and biased to pass a second fraction of said controlled current, whereby said first and second fractions add up to said controlled current value;

first and second output transistors having their drains/collectors coupled together so that the output current is the sum of the output transistor currents;

means for subtracting said second current fraction from the first fraction and applying the difference to said first output transistor; and means for subtracting said first current fraction from the second and applying the difference to said second output transistor whereby, at differential input balance, said output current is zero and the circuit transfer response is folded by falling to zero at balance and rising for either polarity of input.

5. A signal comparator comprising:

a current source for providing a tail current, a load control signal and a biasing signal;

an input amplifier, coupled to said current source, for receiving said tail current, said load control signal, a first input signal, a second input signal and a first fractional current, wherein said first fractional current is proportional to a first difference between said first and second input signals over a first predetermined range of said first difference between said first and second input signals, and wherein said first and second input signals are received from first and second sources external to said signal comparator; and an output amplifier, coupled to said input amplifier and said current source, for receiving said biasing signal, providing said first fractional current and conducting an output current, wherein said output current is proportional to said first fractional current over a portion of said first predetermined range of said first difference between said first and second input signals.

6. A signal comparator as recited in claim 5, wherein said output current exhibits an output versus input transfer function comprising:

a maximum current value when a magnitude of said first input signal is greater than a magnitude of said second input signal by a first predetermined amount;

a substantially linear output versus input transfer function when a difference between said first and second input signal magnitudes is within a second predetermined range; and a minimum current value when said second input signal magnitude is greater than said first input signal magnitude by a second predetermined amount.

7. A signal comparator as recited in claim 5, wherein said current source comprises:

a control signal source for providing a controlled current and said load control signal; and a first current mirror circuit, coupled to said control signal source, for receiving said controlled current and in accordance therewith providing said tail current.

8. A signal comparator as recited in claim 7, wherein said control signal source comprises:

a reference source for providing a reference current; and a second current mirror circuit, coupled to said reference source and said first current mirror circuit, for receiving said reference current and in accordance therewith providing said controlled current and said load control signal.

9. A signal comparator as recited in claim 7, wherein said control signal source is further for providing a bias control signal and said current source further comprises a biasing circuit for receiving said bias control signal and in accordance therewith providing said biasing signal.

10. A signal comparator as recited in claim 5, wherein said input amplifier comprises:

a differential amplifier for receiving said tail current and said first and second input signals and in accordance therewith providing a difference current, wherein said difference current corresponds to said first difference between said first and second input signals; and a first load circuit, coupled to said differential amplifier, for receiving said load control signal, said difference current and said first fractional current.

11. A signal comparator as recited in claim 5, wherein said output amplifier comprises:

a first coupling circuit for receiving said biasing signal and conducting said first fractional current; and a first current mirror circuit, coupled to said first coupling circuit, for providing said first fractional current and in accordance therewith conducting said output current.

12. A signal comparator as recited in claim 5, wherein said output amplifier is further for providing a second fractional current and said input amplifier is further for receiving said second fractional current, wherein said second fractional current is proportional to a second difference between said first and second input signals over a second predetermined range, and wherein said output current is substantially fixed over a portion of said second predetermined range.

13. A signal comparator as recited in claim 12, wherein said output current exhibits an output versus input transfer function comprising:

a maximum current value when a magnitude of said first input signal is greater than a magnitude of said second input signal by a predetermined amount;

a substantially linear output versus input transfer function when a difference between said first and second input signal magnitudes is within a third predetermined range; and a minimum current value when said second input signal magnitude is greater than said first input signal magnitude.

14. A signal comparator as recited in claim 12, wherein said input amplifier comprises:

a differential amplifier for receiving said tail current and said first and second input signals and in accordance therewith providing first and second difference currents, wherein said first difference current corresponds to said first difference between said first and second input signals and said second difference current corresponds to said second difference between said first and second input signals;

a first load circuit, coupled to said differential amplifier, for receiving said load control signal, said first difference current and said first fractional current; and a second load circuit, coupled to said differential amplifier, for receiving said load control signal, said second difference current and said second fractional current.

15. A signal comparator as recited in claim 12, wherein said output amplifier comprises:

a first coupling circuit for receiving said biasing signal and conducting said first fractional current;

a first current mirror circuit, coupled to said first coupling circuit, for providing said first fractional current and in accordance therewith conducting said output current;

a second coupling circuit for receiving said biasing signal and conducting said second fractional current; and a second current mirror circuit, coupled to said second coupling circuit and said first current mirror circuit, for providing said second fractional current and in accordance therewith biasing said first current mirror circuit.

16. A signal comparator as recited in claim 5, wherein said output amplifier is further for providing a second fractional current and said input amplifier is further for receiving said second fractional current, wherein said second fractional current is proportional to a second difference between said first and second input signals over a second predetermined range, and wherein said output current is proportional to said second fractional current over a portion of said second predetermined range.

17. A signal comparator as recited in claim 16, wherein said output current exhibits an output versus input transfer function comprising:

a first maximum current value when a magnitude of said first input signal is greater than a magnitude of said second input signal by a first predetermined amount;

a first substantially linear output versus input transfer function when a difference between said first and second input signal magnitudes is within a third predetermined range;

a minimum current value when said second input signal magnitude is approximately equal to said first input signal magnitude;

a second substantially linear output versus input transfer function when said difference between said first and second input signal magnitudes is within a second predetermined range; and a second maximum current value when said second input signal magnitude is greater than said first input signal magnitude by a second predetermined amount.

18. A signal comparator as recited in claim 16, wherein said input amplifier comprises:

a differential amplifier for receiving said tail current and said first and second input signals and in accordance therewith providing first and second difference currents, wherein said first difference current corresponds to said first difference between said first and second input signals and said second difference current corresponds to said second difference between said first and second input signals;

a first load circuit, coupled to said differential amplifier, for receiving said load control signal, said first difference current and said first fractional current; and a second load circuit, coupled to said differential amplifier, for receiving said load control signal, said second difference current and said second fractional current.

19. A signal comparator as recited in claim 16, wherein said output amplifier comprises:

a first coupling circuit for receiving said biasing signal and conducting said first fractional current;

a first driver circuit, coupled to said first coupling circuit, for providing said first fractional current and in accordance therewith providing a first output drive signal;

a second coupling circuit for receiving said biasing signal and conducting said second fractional current;

a second driver circuit, coupled to said second coupling circuit, for providing said second fractional current and in accordance therewith providing a second output drive signal; and an output circuit, coupled to said first and second driver circuits, for receiving said first and second output drive signals and in accordance therewith conducting said output current.

20. A method for providing an output signal based upon a comparison between two input signals, said method comprising the steps of:

providing a tail current;

providing a load control signal;

providing a biasing signal;

receiving first and second input signals which are generated externally;

conducting a first fractional current in accordance with said tail current, said load control signal, said biasing signal and said first and second input signals, wherein said first fractional current is proportional to a first difference between said first and second input signals over a first predetermined range of said first difference between said first and second input signals; and conducting an output current in accordance with said first fractional current, wherein said output current is proportional to said first fractional current over a portion of said first predetermined range of said first difference between said first and second input signals.

21. A method as recited in claim 20, wherein said step of conducting an output current in accordance with said first fractional current comprises:

conducting said output current with a maximum current value when a magnitude of said first input signal is greater than a magnitude of said second input signal by a first predetermined amount;

conducting said output current according to a substantially linear output versus input transfer function when a difference between said first and second input signal magnitudes is within a second predetermined range; and conducting said output current with a minimum current value when said second input signal magnitude is greater than said first input signal magnitude by a second predetermined amount.

22. A method as recited in claim 20, wherein said step of providing a tail current comprises receiving a controlled current and in accordance therewith providing said load control signal and said tail current with a first current mirror circuit.

23. A method as recited in claim 22, wherein said step of receiving a controlled current and in accordance therewith providing said load control signal and said tail current comprises receiving a reference current and in accordance therewith providing said controlled current and said load control signal with a second current mirror circuit.

24. A method as recited in claim 22, wherein said step of providing a tail current further comprises providing a bias control signal to a biasing circuit and in accordance therewith providing said biasing signal.

25. A method as recited in claim 20, wherein said step of conducting a first fractional current in accordance with said tail current, said load control signal, said biasing signal and said first and second input signals comprises:

providing a difference current in accordance with said tail current and said first and second input signals, wherein said difference current corresponds to said first difference between said first and second input signals; and conducting said first fractional current in accordance with said difference current and said load control signal.

26. A method as recited in claim 20, wherein said step of conducting an output current in accordance with said first fractional current comprises providing said first fractional current and in accordance therewith conducting said output current.

27. A method as recited in claim 20, further comprising the steps of:

conducting a second fractional current in accordance with said tail current, said load control signal, said biasing signal and said first and second input signals, wherein said second fractional current is proportional to a second difference between said first and second input signals over a second predetermined range; and conducting said output current in further accordance with said second fractional current, wherein said output current is substantially fixed over a portion of said second predetermined range.

28. A method as recited in claim 27, wherein said step of conducting said output current in accordance with said first and second fractional currents comprises:

conducting said output current with a maximum current value when a magnitude of said first input signal is greater than a magnitude of said second input signal by a predetermined amount;

conducting said output current according to a substantially linear output versus input transfer function when a difference between said first and second input signal magnitudes is within a third predetermined range; and conducting said output current with a minimum current value when said second input signal magnitude is greater than said first input signal magnitude.

29. A method as recited in claim 27, wherein said steps of conducting first and second fractional currents in accordance with said tail current, said load control signal, said biasing signal and said first and second input signals together comprise:

providing first and second difference currents in accordance with said tail current and said first and second input signals, wherein said first difference current corresponds to said first difference between said first and second input signals and said second difference current corresponds to said second difference between said first and second input signals;

conducting said first fractional current in accordance with said first difference current and said load control signal; and conducting said second fractional current in accordance with said second difference current and said load control signal.

30. A method as recited in claim 27, wherein said step of conducting said output current in accordance with said first and second fractional currents comprises providing said first and second fractional currents and in accordance therewith conducting said output current.

31. A method as recited in claim 20, further comprising the steps of:

conducting a second fractional current in accordance with said tail current, said load control signal, said biasing signal and said first and second input signals, wherein said second fractional current is proportional to a second difference between said first and second input signals over a second predetermined range; and conducting said output current in further accordance with said second fractional current, wherein said output current is proportional to said second fractional current over a portion of said second predetermined range.

32. A method as recited in claim 31, wherein said step of conducting said output current in accordance with said first and second fractional currents comprises:

conducting said output current with a first maximum current value when a magnitude of said first input signal is greater than a magnitude of said second input signal by a first predetermined amount;

conducting said output current according to a first substantially linear output versus input transfer function when a difference between said first and second input signal magnitudes is within a third predetermined range;

conducting said output current with a minimum current value when said second input signal magnitude is approximately equal to said first input signal magnitude;

conducting said output current according to a second substantially linear output versus input transfer function when said difference between said first and second input signal magnitudes is within a second predetermined range; and conducting said output current with a second maximum current value when said second input signal magnitude is greater than said first input signal magnitude by a second predetermined amount.

33. A method as recited in claim 31, wherein said steps of conducting first and second fractional currents in accordance with said tail current, said load control signal, said biasing signal and said first and second input signals together comprise:

providing first and second difference currents in accordance with said tail current and said first and second input signals, wherein said first difference current corresponds to said first difference between said first and second input signals and said second difference current corresponds to said second difference between said first and second input signals;

conducting said first fractional current in accordance with said first difference current and said load control signal; and conducting said second fractional current in accordance with said second difference current and said load control signal.

34. A method as recited in claim 31, wherein said step of conducting said output current in accordance with said first and second fractional currents comprises:

providing said first fractional current and in accordance therewith providing a first output drive signal;

providing said second fractional current and in accordance therewith providing a second output drive signal; and conducting said output current in accordance with said first and second output drive signals.

\* \* \* \* \*